(12) United States Patent
Kang et al.

(10) Patent No.: US 11,742,271 B2
(45) Date of Patent: Aug. 29, 2023

(54) SEMICONDUCTOR PACKAGE

(71) Applicant: SAMSUNG ELECTRONICS CO., LTD., Suwon-si (KR)

(72) Inventors: Gyuho Kang, Cheonan-si (KR); Seong-Hoon Bae, Cheonan-si (KR); Jin Ho An, Seoul (KR); Teahwa Jeong, Hwaseong-si (KR); Ju-Il Choi, Seongnam-si (KR); Atsushi Fujisaki, Seongnam-si (KR)

(73) Assignee: SAMSUNG ELECTRONICS CO., LTD.

( * ) Notice: Subject to any disclaimer, the term of this patent is extended or adjusted under 35 U.S.C. 154(b) by 31 days.

(21) Appl. No.: 17/306,988

(22) Filed: May 4, 2021

(65) Prior Publication Data

US 2022/0077043 A1 Mar. 10, 2022

(30) Foreign Application Priority Data

Sep. 8, 2020 (KR) .................. 10-2020-0114829

(51) Int. Cl.
*H01L 23/498* (2006.01)
*H01L 25/10* (2006.01)
*H01L 23/00* (2006.01)
*H01L 25/065* (2023.01)

(52) U.S. Cl.
CPC .. *H01L 23/49822* (2013.01); *H01L 23/49816* (2013.01); *H01L 23/49833* (2013.01); *H01L 23/49838* (2013.01); *H01L 24/05* (2013.01); *H01L 24/16* (2013.01); *H01L 25/0655* (2013.01); *H01L 25/105* (2013.01); *H01L 2224/0401* (2013.01); *H01L 2224/05015* (2013.01); *H01L 2224/05017* (2013.01); *H01L 2224/05555* (2013.01); *H01L 2224/05558* (2013.01); *H01L 2224/05582* (2013.01); *H01L 2224/16227* (2013.01);
(Continued)

(58) Field of Classification Search
None
See application file for complete search history.

(56) References Cited

U.S. PATENT DOCUMENTS

| 6,740,985 | B1 | 5/2004 | Zhao |
| 7,525,186 | B2 | 4/2009 | Kim et al. |
| 7,550,376 | B2 | 6/2009 | Watanabe |

(Continued)

FOREIGN PATENT DOCUMENTS

KR 101429347 B1 8/2014

*Primary Examiner* — Long Pham
(74) *Attorney, Agent, or Firm* — Fish & Richardson P.C.

(57) ABSTRACT

A semiconductor package includes; a redistribution substrate including a redistribution pattern, a semiconductor chip mounted on a top surface of the redistribution substrate, and a connection terminal between the semiconductor chip and the redistribution substrate. The redistribution substrate further includes; a pad structure including a pad interconnection and a pad via, disposed between the redistribution pattern and the connection terminal, wherein the pad structure is electrically connected to the redistribution pattern and a top surface of the pad structure contacts the connection terminal, a shaped insulating pattern disposed on a top surface of the redistribution pattern, and a pad seed pattern disposed on the redistribution pattern and covering the shaped insulating pattern.

20 Claims, 17 Drawing Sheets

(52) U.S. Cl.
CPC ............... *H01L 2224/16238* (2013.01); *H01L 2924/1431* (2013.01); *H01L 2924/1434* (2013.01); *H01L 2924/182* (2013.01)

(56) References Cited

U.S. PATENT DOCUMENTS

| | | |
|---|---|---|
| 7,846,618 B2 | 12/2010 | Chai et al. |
| 8,344,514 B2 | 1/2013 | Cobbley et al. |
| 8,378,495 B2 | 2/2013 | West |
| 9,293,403 B2 | 3/2016 | Park et al. |
| 9,716,071 B2 * | 7/2017 | Ryu .................. H01L 24/05 |
| 2009/0184424 A1 | 6/2009 | Furusawa et al. |
| 2022/0238469 A1 * | 7/2022 | Lim .................. H01L 23/5389 |

\* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0114829 filed on Sep. 8, 2020 in the Korean Intellectual Property Office, the subject matter of which is hereby incorporated by reference.

BACKGROUND

Embodiments of the inventive concept relate generally to semiconductor packages and, more particularly, to semiconductor packages including a redistribution substrate.

An integrated circuit chip may be realized as a semiconductor package in order to be variously configured (or applied) to an electronic product. In a typical semiconductor package, a semiconductor chip is mounted on a printed circuit board (PCB) and electrically connected to conductive patterns and/or circuits of the PCB via bonding wires and/or conductive bumps. Various techniques intended to improve the reliability of semiconductor packages have been proposed as the physical size of semiconductor packages continues to decrease.

SUMMARY

Embodiments of the inventive concept provide semiconductor packages exhibiting improved electrical and mechanical performance.

In one aspect, a semiconductor package may include; a redistribution substrate including a redistribution pattern, a semiconductor chip mounted on a top surface of the redistribution substrate and a connection terminal between the semiconductor chip and the redistribution substrate. The redistribution substrate may further include; a pad structure including a pad interconnection and a pad via, disposed between the redistribution pattern and the connection terminal, wherein the pad structure is electrically connected to the redistribution pattern and a top surface of the pad structure contacts the connection terminal, a shaped insulating pattern disposed on a top surface of the redistribution pattern, and a pad seed pattern disposed on the redistribution pattern and covering the shaped insulating pattern.

In another aspect, a semiconductor package may include; a redistribution substrate including a redistribution pattern and an insulating layer, a semiconductor chip mounted on a top surface of the redistribution substrate, a first connection terminal between the semiconductor chip and the redistribution substrate; and a molding layer provided on the redistribution substrate and covering the semiconductor chip. The redistribution substrate further include; a pad structure including a pad via and a pad interconnection and disposed in contact with a bottom surface of the first connection terminal, wherein a top surface of the pad structure is disposed at a higher level than the top surface of the redistribution substrate, a pad seed pattern disposed between the redistribution pattern and the pad structure, and a shaped insulating pattern including at least one portion disposed between a top surface of the redistribution pattern and the pad seed pattern, wherein the at least one portion of the shaped insulating pattern having a maximum width less than a minimum width of the pad via.

In another aspect, a semiconductor package may include; a redistribution substrate including a redistribution pattern and an insulating layer, a semiconductor chip mounted on a top surface of the redistribution substrate, and a connection terminal on a bottom surface of the redistribution substrate. The redistribution substrate may further include; a pad pattern provided between the redistribution pattern and the connection terminal and including a pad interconnection and a pad via on the pad interconnection, wherein a bottom surface of the pad pattern contacts the connection terminal and the pad pattern is electrically connected to the redistribution pattern, a pad seed pattern provided between the redistribution pattern and the pad pattern, and a shaped insulating pattern disposed between a bottom surface of the redistribution pattern and the pad seed pattern.

BRIEF DESCRIPTION OF THE DRAWINGS

The inventive concept will become more apparent to those skilled in the art upon consideration of the following written description together with the accompanying drawings.

DETAILED DESCRIPTION

Hereinafter, embodiments of the inventive concept will be described in some additional detail with reference to the accompanying drawings.

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

As used herein, the phrase "electrically connected" denotes either a direct electrical connection (i.e., a physical contact) between two elements or components, or an indirect electrical connection, wherein one or more intervening elements, components and/or material layer(s) may be disposed between the two elements or components.

As used herein, the term "level" denotes a relative height, or vertically disposition above an arbitrarily selected horizontal plane. For example, a principal surface of a material layer, an upper surface of an underlying PCB, an imaginary horizontal plane extending through a particular point, etc. may be assumed as a level reference. Hence, a level within a semiconductor package may be measured in a vertical direction substantially perpendicular to an assumed level reference.

As used herein, the term 'width' denotes a distance measured in a horizontal direction substantially parallel to the horizontal plane of an assumed level reference, and the term 'thickness' denotes a distance measured in a vertical direction substantially perpendicular to the horizontal plane of the assumed level reference.

Figure 1:
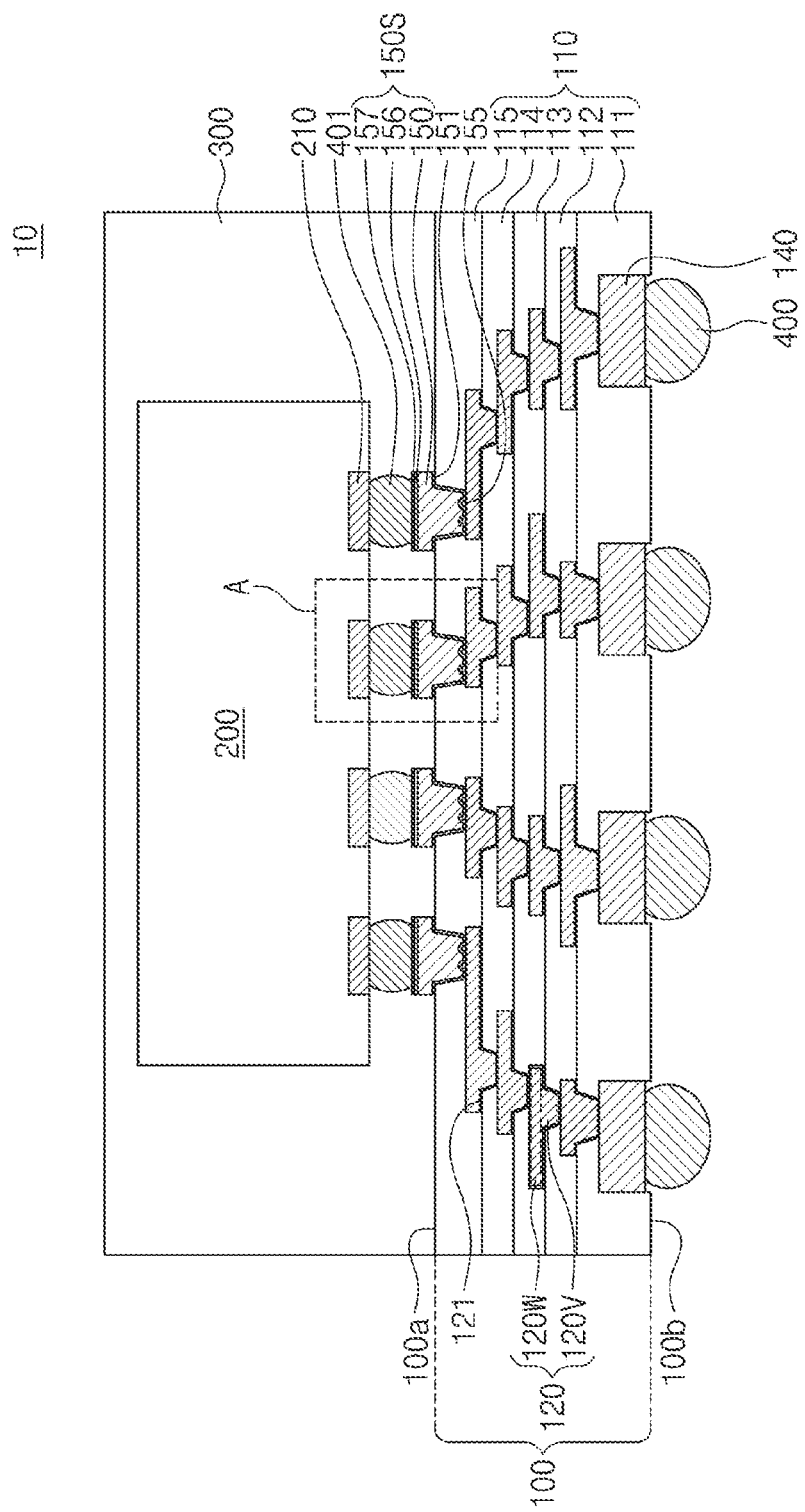
FIG. 1 is a cross-sectional view illustrating a semiconductor package according to embodiments of the inventive concept.
Figure 2A:
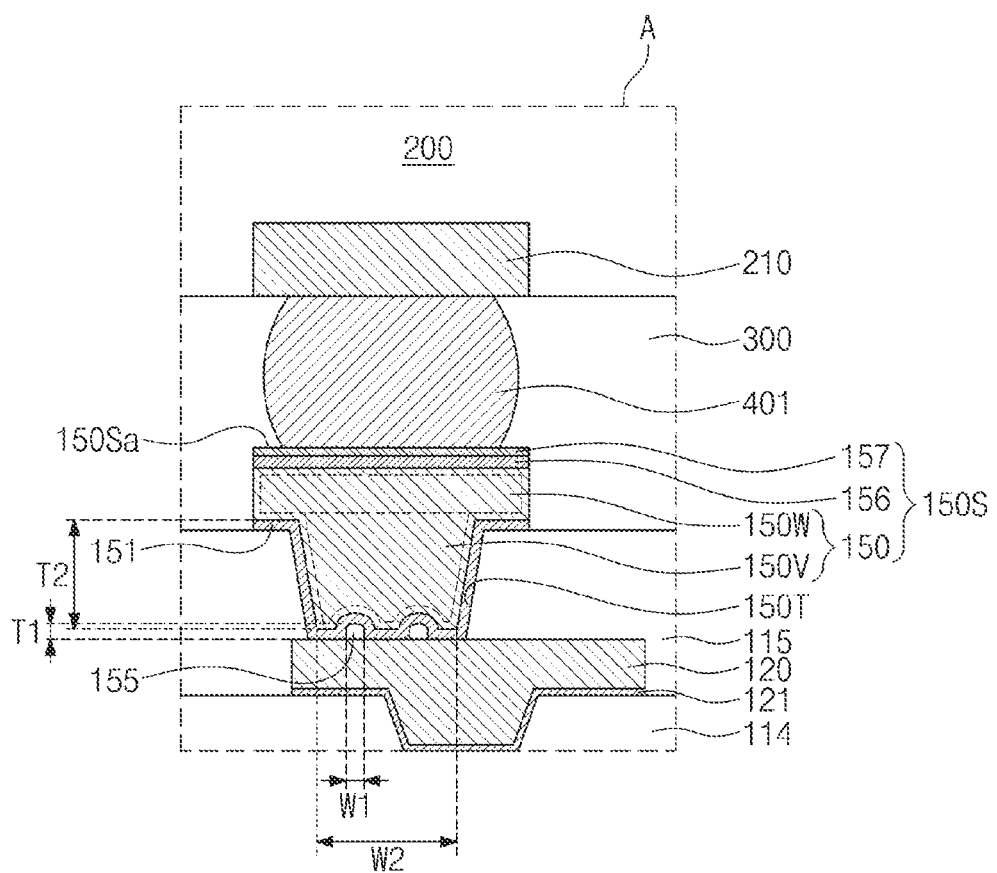
FIGS. 2A, 2B and 2C are respective, enlarged cross-sectional view of region 'A' in FIG. 1 further illustrating alternate semiconductor packages according to embodiments of the inventive concept.

Figure (FIG. 1 is a cross-sectional view illustrating a semiconductor package 10 according to embodiments of the inventive concept; FIG. 2A is an enlarged cross-sectional view of region 'A' in FIG. 1; and FIG. 3A is an enlarged plan view of region 'A' in FIG. 1.

Figure 3A:
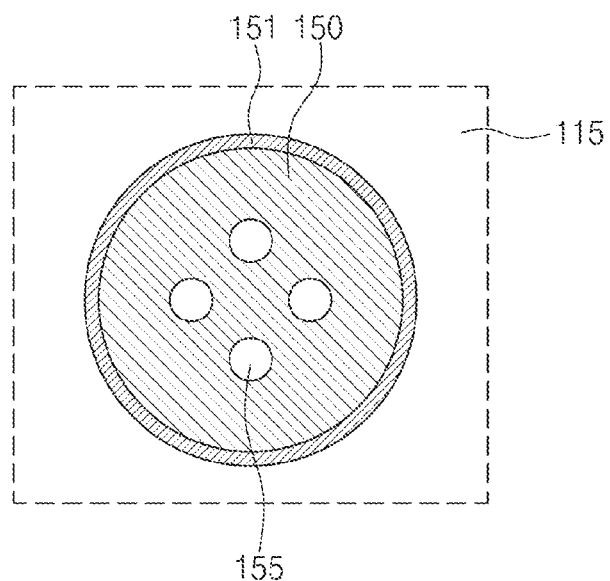
FIGS. 3A, 3B and 3C are respective, enlarged plan (or top-down) views of region 'A' in FIG. 1 further illustrating the alternate semiconductor packages of FIGS. 2A, 2B and 2C according to embodiments of the inventive concept.

Referring collectively to FIGS. 1, 2A and 3A, the semiconductor package 10 may include a redistribution substrate 100 including a redistribution pattern 120. A semiconductor chip 200 may be disposed on a top surface 100a of the redistribution substrate 100 and first connection terminals 401 may be provided between the redistribution substrate 100 and the semiconductor chip 200. A pad structure 150S may be provided between the redistribution pattern 120 and the first connection terminal 401, and second connection terminals 400 may be disposed on a bottom surface 100b of the redistribution substrate 100. The redistribution substrate 100 may be a wafer-level substrate or a panel-level substrate, as examples.

The redistribution pattern 120 may include multiple and variously arranged redistribution patterns and/or components, For example, the redistribution pattern 120 may include via patterns 120V and interconnection patterns 120W. Here, the constituent patterns and components of the redistribution pattern 120 may include one or more conductive materials, such as copper (Cu).

An insulating layer 110 may be variously configured to selectively insulate components (e.g., selected portions and/or surfaces of the components) of the redistribution pattern 120. For example, as illustrated in FIG. 1, the insulating layer 110 may include multiple insulating layers (e.g., first, second, third, fourth and fifth insulating layers 111, 112, 113, 114 and 115) sequentially arranged in a vertically-extending stack. Here, the first insulating layer 111 may be a lowermost insulating layer of the insulating layer 110, and the fifth insulating layer 115 may be an uppermost insulating layer of the insulating layer 110. One or more of the insulating layers (e.g., insulating layers 111, 112, 113, 114 and 115) forming the insulating layer 110 may include an organic material, such as a photosensitive polymer. In this regard, the photosensitive polymer may include at least one of a photosensitive polyimide, a polybenzoxazole, a phenol-based polymer, a benzocyclobutene-based polymer, etc. In some embodiments, the insulating layer 110 may include, but not limited to, a photo imagable dielectric (PID).

In the illustrated example of FIG. 1, a combination of the redistribution layer 120 and the insulating layer 110 may be disposed between the pad structure 150S and an under bump pattern 140 electrically connecting the second connection terminals 400. Each second connection terminal 400 may include at least one of a solder ball, a pillar, a bump, etc. In this regard, each second connection terminal 400 may include at least one conductive material, such as a metal or metal alloy like (e.g.) tin (Sn), lead (Pb), nickel (Ni), gold (Au), silver (Ag), copper (Cu), aluminum (Al) and bismuth (Bi). Each second connection terminal 400 may function as an external terminal providing one or more electrical connection paths between the semiconductor package 10 and one or more external device(s).

In some embodiments, the under bump pattern 140 may be provided within the first insulating layer 111 and may include multiple portions exposed through the first insulating layer 111. In this manner, the under bump pattern 140 may provide various, horizontally spaced-apart, exposed surfaces, each of which may respectively be used to electrically connect one of the second connection terminals 400.

In some embodiments, each of the second connection terminals 400 may directly contact an exposed surface of the under bump pattern 140. In this regard, bottom surface portions of the under bump pattern 140 exposed through the first insulating layer 111 may be disposed at a level higher than a level of the bottom surface 100b of the redistribution substrate 100. That is, exposed portions of the under bump pattern 140 may serve as respective connection pads for the second connection terminals 400. In some embodiments, the under bump pattern 140 may include one or more conductive materials, such as copper (Cu).

In FIG. 1, the various components of the redistribution pattern 120 and the constituent insulating layers of the insulating layer 110 may be vertically stacked on the under bump pattern 140. Thus, primary surfaces of the redistribution pattern 120 and the insulating layer 110 may be understood as having a substantially horizontal disposition.

The various components of the redistribution pattern 120 may be selectively covered or exposed by one or more of the insulating layers 110 to allow (e.g.) one or more electrical connections between the components in the redistribution patterns 120. For example, assuming multiple conductive levels in the redistribution pattern 120, each one of the levels may include at least one vertically-extending via pattern 120V and at least one horizontally-extending interconnection pattern 120W. Thus, an interconnection pattern 120W exposed through a corresponding insulating layer 110 and associated with one level of the redistribution pattern 120 may be electrically connected to a via pattern 120V extending from another level (e.g., an overlying level) of the redistribution pattern 120.

In some embodiments, each via pattern 120V may extend downward from a corresponding interconnection pattern 120W to electrically connect a lower level of the redistribution pattern 120 or the bump pattern 140. In this regard, a combination of at least one via pattern 120V and at least one interconnection pattern 120W may constitute a single "redistribution pattern" among a multiplicity of redistribution patterns forming the redistribution pattern 120.

A redistribution seed pattern 121 may be provided on a bottom and/or top surface of the redistribution patterns. Accordingly, a redistribution seed pattern 121 disposed on a bottom surface of a lowermost redistribution pattern may directly contact the under bump pattern 140. Here, the redistribution seed pattern 121 may include at least one conductive material, such as copper (Cu), titanium (Ti), and/or an alloy thereof. In some embodiments, a width of an interconnection pattern 120W in a particular redistribution pattern may be greater than a width of a corresponding via pattern 120V.

In some embodiments, each via pattern 120V may have a wedge shape defined by a top width of a top surface of the via pattern 120V being greater than a bottom width of a bottom surface of the via pattern 120V.

With the foregoing configuration in mind, a pad pattern 150 associated with the pad structure 150S may be formed in relation to a recess region 150T (see, FIG. 2A) formed in the fifth insulating layer 115. A bottom surface of the recess region 150T may expose a portion of a top surface of an uppermost redistribution pattern in the redistribution pattern 120. A shaped insulating pattern 155 may be provided on the exposed top surface of the uppermost redistribution pattern (e.g. a top surface of the redistribution substrate 100). Here, the shaped insulating pattern 155 may include multiple portions arranged (e.g.) in a quadrilateral arrangement, a polygonal arrangement, or a circular arrangement, as viewed in plan. In some embodiments, each of the portions of the shaped insulating pattern 155 may have a hemispherical, upwardly-convex shape.

When the shaped insulating pattern 155 includes two or more portions, the respective portions may be spaced apart across the top surface of the redistribution substrate 100. Thus, a width of the shaped insulating pattern 155 may be less than a width of the bottom surface of the recess region 150T. The shaped insulating pattern 155 may include at least one of the material(s) used to form the insulating layer 110 (e.g., a material used to form the fifth insulating later 115). Thus, the shaped insulating pattern 155 may include an organic material such as a photosensitive polymer, wherein the photosensitive polymer may include one or more of a photosensitive polyimide, a polybenzoxazole, a phenol-based polymer, a benzocyclobutene-based polymer, etc. In some embodiments, the shaped insulating pattern 155 may include, but not limited to, a photo imagable dielectric (PID).

A pad seed pattern 151 may also be provided in the recess region 150T. For example, the pad seed pattern 151 may be conformally formed on the pad pattern 150 (e.g., in the bottom surface of the recess region 150T) and may cover at least a portion of a top surface of the shaped insulating pattern 155. The pad seed pattern 151 may be formed in direct contact with the uppermost redistribution pattern 120 of the redistribution patterns 120. The pad structure 150S may be provided on the pad seed pattern 151. An arrangement of pad structures 150S may be spaced apart across the top surface 100a of the redistribution substrate 100.

Thus, in some embodiments, each pad structure 150S in the arrangement of pad structures 150S may include a pad pattern 150, a first metal pattern 156 on the pad pattern 150, and a second metal pattern 157 on the first metal pattern 156. Here, the pad pattern 150 may fill a remaining portion of the recess region 150T. The pad pattern 150 may include one or more conductive materials, such as copper (Cu), and the pad seed pattern 151 may include one or more conductive materials, such as copper (Cu), a copper alloy, titanium (Ti), a titanium alloy, etc.

In some embodiments, the pad pattern 150 may include a pad via 150V and a pad interconnection 150W provided on the pad via 150V. The pad interconnection 150W may extend horizontally in parallel with the top surface 100a of the redistribution substrate 100 and the pad via 150V may vertically protrude downward from the pad interconnection 150W. Here, a width of the pad interconnection 150W may be greater than a width of the pad via 150V, and a top width of the (wedge-shaped) pad via 150V may be greater than a bottom width of the pad via 150V. The fifth insulating layer 115 may cover the portions of the pad via 150V (e.g., sidewall portions). In contrast, the pad interconnection 150W may substantially extend above the fifth insulating layer 115, such that that it is exposed on the top surface 100a of the redistribution substrate 100.

The first metal pattern 156 and the second metal pattern 157 may be conformally formed on the pad pattern 150. The first metal pattern 156 and the second metal pattern 157 may cover a top surface of the pad pattern 150. The first metal pattern 156 and the second metal pattern 157 may include different materials from each other. The first metal pattern 156 may include one or more conductive material(s), such as nickel (Ni). The second metal pattern 157 may include one or more conductive material(s) such as gold (Au).

A maximum width W1 of each portion of the shaped insulating pattern 155 may be less than a minimum width W2 of the pad via 150V. The maximum width W1 of a portion of the shaped insulating pattern 155 may range from between about 1 μm to about 15 μm. A maximum thickness T1 of a portion of the shaped insulating pattern 155 may be less than a thickness T2 of the pad via 150V. The maximum thickness T1 of each portion of the shaped insulating pattern 155 may range from between about 1 μm to about 2 μm. Thus, the pad pattern 150 may be electrically connected to the redistribution pattern 120 despite the presence of the shaped insulating pattern 155.

Typically, a pad via adjacent to a connection terminal may be formed in a recess region having a relatively great width. Thus, a dimpled structure in which a top surface of a pad portion has a concave shape may be formed. However, this type of dimpled structure may increase in size with a corresponding increase in the size of the pad via, and this outcome tends to constrain the geometry of the pad via.

With the foregoing in mind, semiconductor packages according to embodiments of the inventive concept provide the shaped insulating pattern 155 that may be formed on the bottom surface of the recess region 150T, thereby preventing formation of a dimpled structure in which the top surface of the pad interconnection 150W is concaved. In other words, the top surface of the pad interconnection 150W may remain substantially parallel to the top surface 100a of the redistribution substrate 100. In addition, since formation of the dimpled structure is prevented, a high degree of design freedom for the pad via 150V may be maintained, thereby improving overall electrical performance of the semiconductor package. Furthermore, a contact area between the pad pattern 150 and the pad seed pattern 151 may be increased due to the formation of the shaped insulating pattern 155, thereby improving the mechanical properties of the semiconductor package.

The semiconductor chip 200 may be mounted on the top surface 100a of the redistribution substrate 100. For example, the semiconductor chip 200 may be a memory chip, a logic chip, a sensing chip, etc. However, embodiments of the inventive concept are not limited thereto. In this regard, a memory chip may be (e.g.) a Dynamic Random Access Memory (DRAM) chip, a Static RAM (SRAM) chip, a Magnetic RAM (MRAM) chip, a flash memory chip, etc. Hence, the semiconductor chip 200 may include chip pads 210 provided at lower portions of the semiconductor chip 200, wherein the chip pads 210 are configured for electrically connection with integrated circuits of the semiconductor chip 200 via interconnection lines.

An arrangement of the first connection terminals 401 may be provided on the pad structure 150S, such that the first connection terminals 401 are disposed between the semiconductor chip 200 and the redistribution substrate 100. Each first connection terminal 401 may be provided between a pad structure 150S and a chip pad 210 in order to electrically connect the pad structure 150S and the chip pad 210. That is, the semiconductor chip 200 may be electrically connected to the second connection terminals 400 through the first connection terminals 401. Accordingly, each first connection terminal 401 may directly contact a top surface 150Sa of the pad structure 150S. The top surface 150Sa of the pad structure 150S may correspond to a top surface of the second metal pattern 157. That is, the first connection terminal 401 may directly contact the second metal pattern 157. The first connection terminal 401 may include at least one of a solder ball, a pillar, a bump, etc. The first connection terminal 401 may include one or more conductive material(s) such as; tin (Sn), lead (Pb), nickel (Ni), gold (Au), silver (Ag), copper (Cu), aluminum (Al), bismuth (Bi), etc.

A molding layer 300 may be provided on the redistribution substrate 100 to cover the top surface 100a of the redistribution substrate 100 and the semiconductor chip 200. The molding layer 300 may cover the pad interconnection 150W, the first metal pattern 156, and the second metal pattern 157. The molding layer 300 may include an insulating polymer such as an epoxy molding compound (EMC).

Figure 2B:
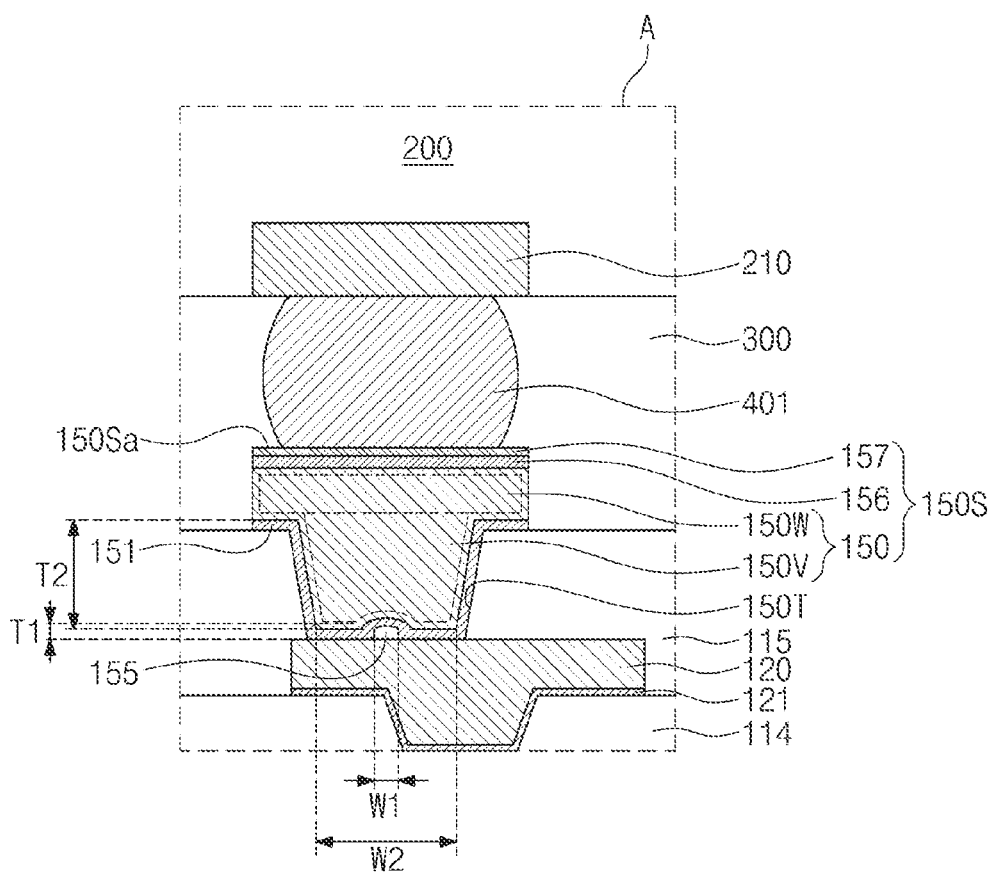
Figure 3B:
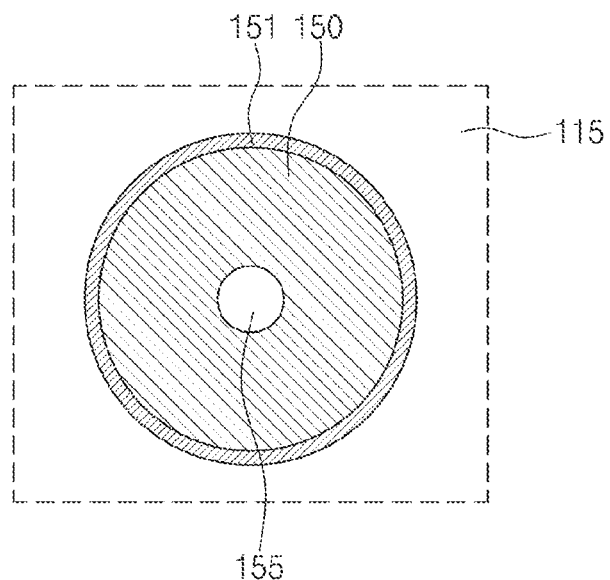

FIG. 2B is another enlarged cross-sectional view portion A in the semiconductor package of FIG. 1 and FIG. 3B is a corresponding plan view.

Referring to FIGS. 2B and 3B, the illustrated embodiment includes the shaped insulating pattern 155 having only a single portion provided on the bottom surface of the recess region 150T. In this regard, the single portion of the shaped insulating pattern 155 may be provided at a center point of the recess region 150T, as viewed in plan. Here, the single portion of the shaped insulating pattern 155 may have a hemispherical upwardly-convex shape.

The single portion of the shaped insulating pattern 155 may have a maximum width W1 less than a minimum width W2 of the pad via 150V. The maximum width W1 of the shaped insulating pattern 155 may range from between about 1 μm to about 15 μm. A maximum thickness T1 of the shaped insulating pattern 155 may be less than a thickness T2 of the pad via 150V. The maximum thickness T1 of the shaped insulating pattern 155 may range from between about 1 μm to about 2 μm. Thus, despite the presence of the shaped insulating pattern 155, the pad pattern 150 may be effectively electrically connected to the redistribution pattern 120.

Figure 2C:
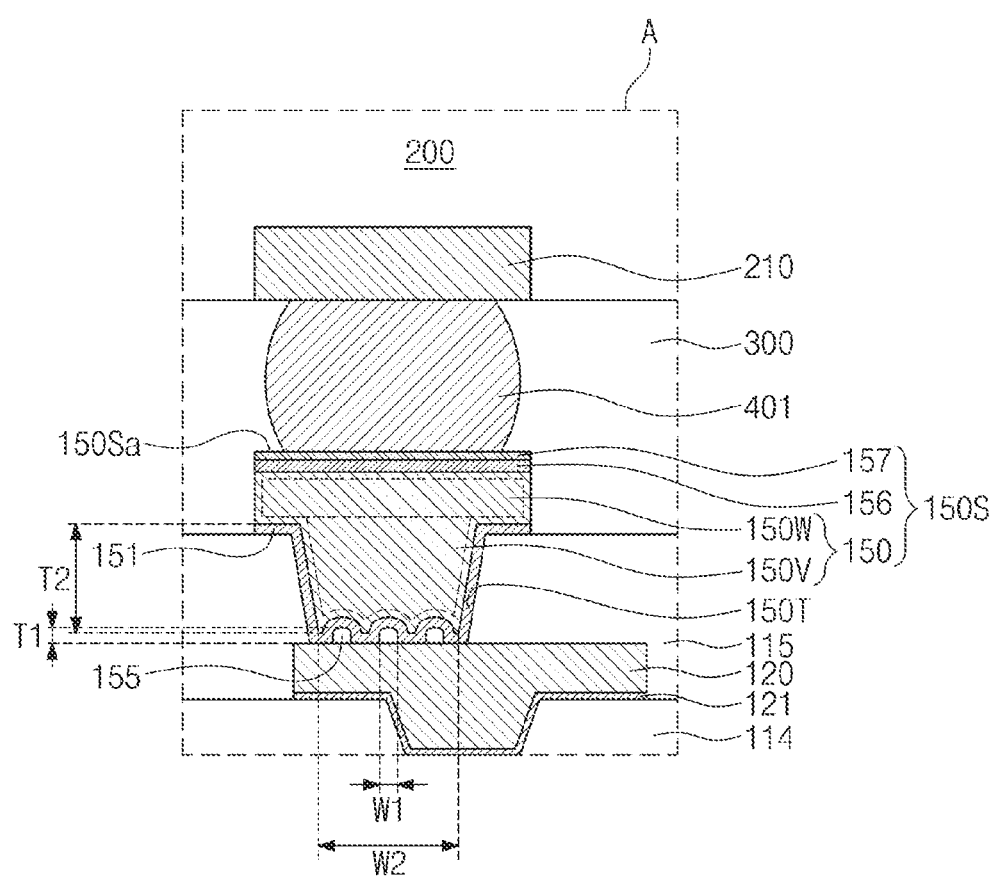
Figure 3C:
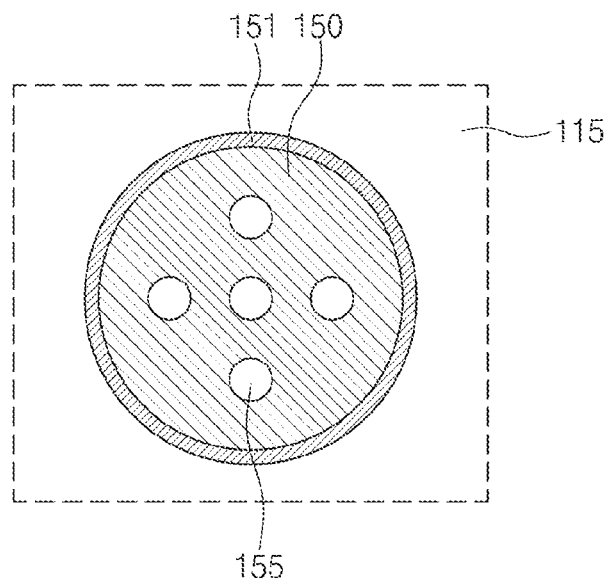

FIG. 2C is still another enlarged cross-sectional view of portion A of the semiconductor package 10 of FIG. 1 and FIG. 3C is a corresponding plan view.

Referring to FIGS. 2C and 3C, the illustrated embodiment includes the shaped insulating pattern 155 including multiple portions arranged in desired pattern on the bottom surface of the recess region 150T. When viewed in plan, one portion of the shaped insulating pattern 155 is provided at a center point of the recess region 150T, while other portions are arranged around the one portion of the insulating patterns 155. Each of the portions of the shaped insulating pattern 155 may have a hemispherical upwardly-convex shape. Alternately, portions of the shaped insulating pattern 155 may be arranged in a quadrilateral arrangement or a polygonal arrangement.

Here, a maximum width W1 of each portion of the shaped insulating pattern 155 may be less than a minimum width W2 of the pad via 150V. The maximum width W1 of each portion of the shaped insulating pattern 155 may range from between about 1 μm to about 15 μm. A maximum thickness T1 of each portion of the shaped insulating pattern 155 may be less than a thickness T2 of the pad via 150V. The maximum thickness T1 of each portion of the shaped insulating pattern 155 may range from between about 1 μm to about 2 μm. Accordingly, despite the presence of the shaped insulating pattern 155, the pad pattern 150 may be effectively electrically connected to the redistribution pattern 120.

From the forgoing variations, those skilled in the art will recognize that embodiments of the inventive concept may include a variety of shaped insulating layer 155 having a variable number and variously shaped portions.

Figure 4:
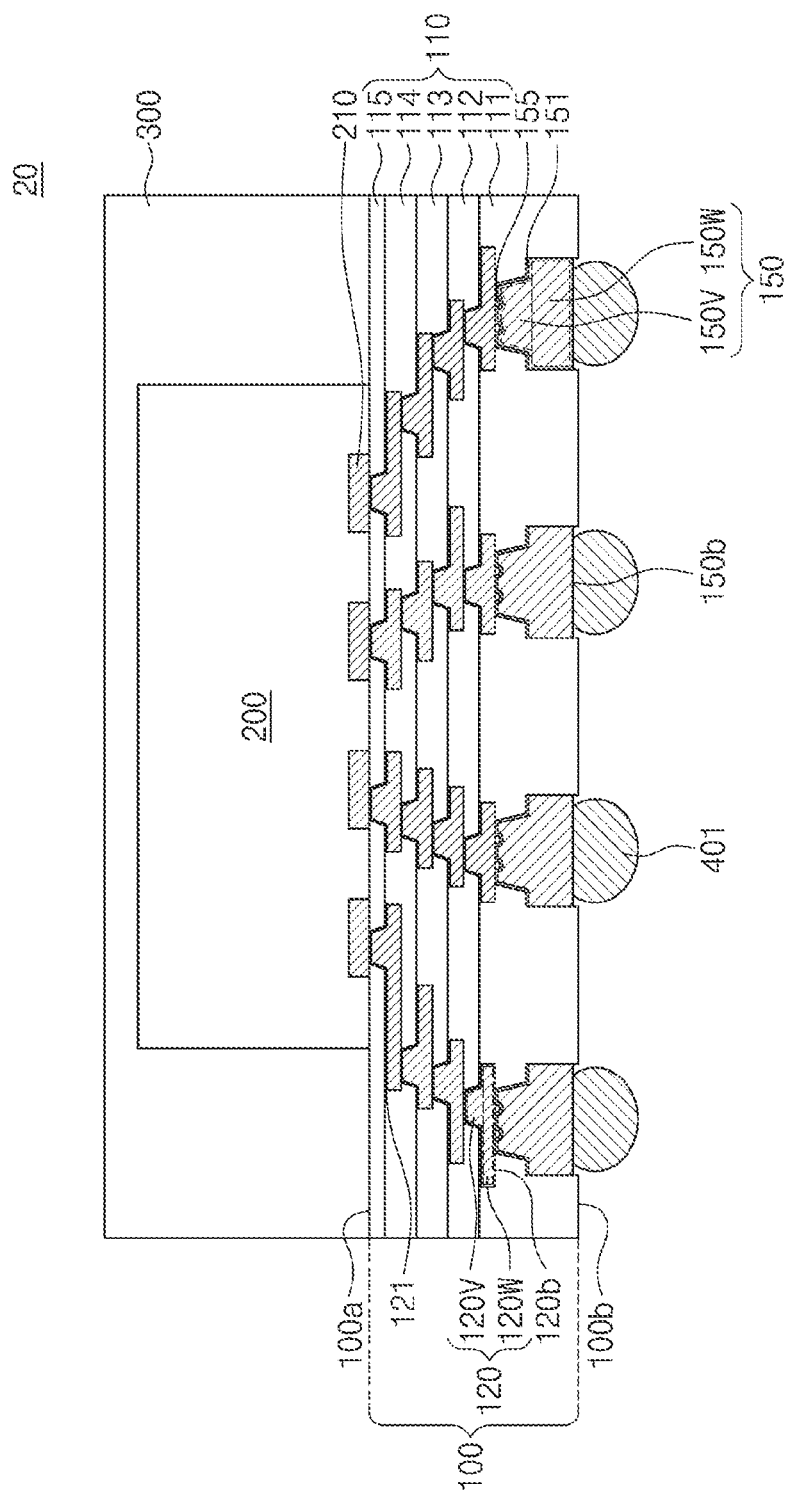
FIG. 4 is a cross-sectional view illustrating a semiconductor package according to embodiments of the inventive concept.

FIG. 4 is a cross-sectional view illustrating a semiconductor package according to embodiments of the inventive concept.

Referring to FIG. 4, a semiconductor package 20 may include the redistribution substrate 100 including the redistribution pattern 120, a semiconductor chip 200 provided on the top surface 100a of the redistribution substrate 100, the first connection terminals 401 provided on the bottom surface 100b of the redistribution substrate 100, and respective pad patterns 150 provided between corresponding first connection terminals 401 and the redistribution pattern 120.

The redistribution substrate 100 may again include the redistribution pattern 120 and an insulating layer 110, wherein the insulating layer 110 may include first to fifth insulating layers 111, 112, 113, 114 and 115. The various redistribution patterns collectively forming the redistribution pattern 20 may be vertically stacked on the top surface 100a of the redistribution substrate 100. Each of the redistribution patterns may include a vertically-extending via pattern 120V and a horizontally-extending interconnection pattern 120W, however each the via pattern 120V may be provided on a corresponding interconnection pattern 120W. Further, each via pattern 120V may have an upward wedge or upwardly tapering shape, wherein a top width of the via pattern 120V may be less than a bottom width of the via pattern 120V. A width of the interconnection pattern 120W may be greater than a width of the via pattern 120V.

The redistribution seed pattern 121 may be provided on top and/or top surfaces of each of the redistribution patterns. The redistribution seed pattern 121 on the top surface of an uppermost one of the redistribution patterns 120 may be in direct contact with a chip pad 210.

The first connection terminals 401 may be provided on the bottom surface 100b of the redistribution substrate 100, and each first connection terminal 401 may serve as an external terminal connecting one or more external device(s).

The pad pattern 150, the pad seed pattern 151 and the shaped insulating pattern 155 may be substantially the same as those described in relation to FIGS. 2A and 3A. Thus, FIG. 2A corresponds to a cross-sectional view illustrating a partial region of FIG. 4, albeit when turned over. Accordingly, those skilled in the art will recognize that various designations of top surface, bottom surface, upper portion and lower portion are fully arbitrary.

Referring to FIGS. 4, 2A and 3A, the pad pattern 150 may be provided on the first connection terminal 401. A pad pattern 150 may be disposed between a first connection terminal 401 and a lowermost one of the redistribution patterns 120. The pad pattern 150 may be formed in the first insulating layer 111. Multiple pad patterns 150 may be arranged to respectively correspond with the first connection terminals 401. Thus, the pad patterns 150 may be spaced apart across the top surface 100a of the redistribution substrate 100.

Here, as noted above, each of the pad patterns 150 may include a pad via 150V and a pad interconnection 150W. The pad via 150V may be provided on the pad interconnection 150W. Each pad interconnection 150W extends horizontally, and each pad via 150V (having an upwardly tapered wedge shape) may extend vertically upward.

Here, it should be noted that some semiconductor packages according to embodiments of the inventive concept may not include the first metal pattern 156 and/or the second metal pattern 157. That is, the bottom surface 150b of the pad pattern 150 may directly contact the first connection terminal 401. Nonetheless, the bottom surface 150b of the pad pattern 150 may be disposed at a higher level than the bottom surface 100b of the redistribution substrate 100.

A pad seed pattern 151 may be provided on the pad pattern 150. The pad seed pattern 151 may be provided between the pad pattern 150 and the lowermost redistribution pattern 120 of the redistribution patterns 120. The pad seed pattern 151 may be conformally formed on the pad pattern 150 and may cover a top surface of the pad pattern 150. At least one insulating pattern 155 may be provided between the pad seed pattern 151 and a bottom surface 120b of the lowermost redistribution pattern 120 of the redistribution patterns 120. For example, the insulating pattern 155 may have a hemispherical shape convex toward the bottom surface 100b of the redistribution substrate 100. Unlike FIG. 2A, the insulating pattern 155 may have a quadrilateral shape or a polygonal shape. The insulating pattern 155 may have a circular shape when viewed in a plan view. Unlike FIG. 3A, the insulating pattern 155 may have a quadrilateral shape or a polygonal shape when viewed in a plan view. The insulating pattern 155 may be provided in plurality, and the plurality of insulating patterns 155 may be spaced apart from each other in the direction parallel to the top surface 100a of the redistribution substrate 100. The insulating pattern 155 may include the same material as the insulating layer 110. A maximum width W1 of the insulating pattern 155 may be less than a minimum width W2 of the pad via 150V. The maximum width W1 of the insulating pattern 155 may range from 1 μm to 15 μm. A maximum thickness T1 of the insulating pattern 155 may be less than a thickness T2 of the pad via 150V.

Referring to FIG. 4, the semiconductor package 20 may include the shaped insulating pattern 155 formed on the bottom surface 120b of the lowermost redistribution pattern 120 of the redistribution patterns 120, thereby preventing formation of a dimpled structure in which the bottom surface 150b of the pad pattern 150. As a result, the bottom surface 150b of the pad pattern 150 may be substantially parallel with the bottom surface 100b of the redistribution substrate 100.

The semiconductor chip 200 may be mounted on the top surface 100a of the redistribution substrate 100. The semiconductor chip 200 may include chip pads 210 provided on a lower portion of the semiconductor chip 200. The chip pads 210 may be used to electrically connect an uppermost one of the redistribution patterns 120. Hence, the chip pads 210 may be used to variously, electrically interconnect the integrated circuits of the semiconductor chip 200, and the semiconductor chip 200 may be electrically connected to the first connection terminal 401 using the chip pads 210.

FIGS. 5 to 10 are related cross-sectional views illustrating in one example a method of manufacture for semiconductor packages according to embodiments of the inventive concept.

Figure 5:
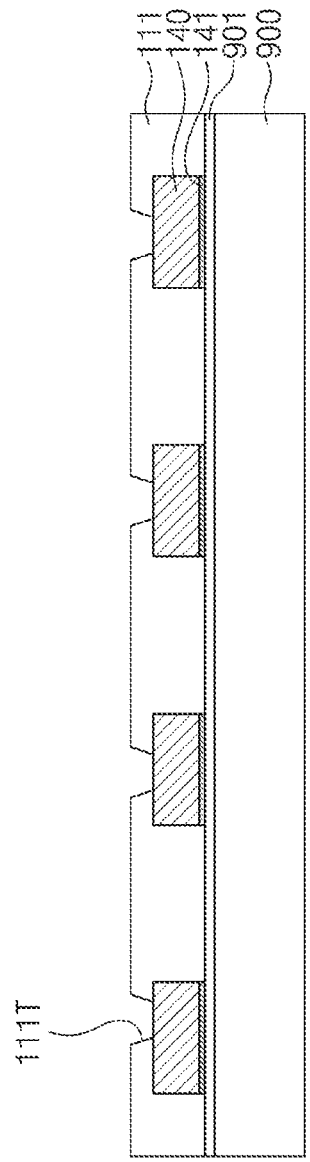
FIGS. 5, 6, 7, 8, 9 and 10 (hereafter collectively, FIGS. 5 to 10) are related cross-sectional views illustrating in one example a method of manufacture for semiconductor packages according to embodiments of the inventive concept.

Referring to FIG. 5, a carrier adhesive layer 901 may be formed on a carrier substrate 900. The carrier adhesive layer 901 may adhere the first insulating layer 111 to the carrier substrate 900. A plurality of lower seed patterns 141 may be formed on the carrier adhesive layer 901. The lower seed patterns 141 may be formed using deposition and etching processes. Then, portions of the under bump pattern 140 may be respectively formed on the lower seed patterns 141. Here, the under bump pattern 140 may be formed using an electroplating process that uses the lower seed patterns 141 as respective electrodes, followed by an etching process.

The first insulating layer 111 may then be formed on the carrier adhesive layer 901 to cover the lower seed patterns 141 and the under bump pattern 140. The first insulating layer 111 may be formed using a coating process, such as a spin coating process or a slit coating process. The first insulating layer 111 may then be patterned to selectively form holes 111T in the first insulating layer 111. Each of the holes 111T exposes at least a portion of a top surface of the respective portions of the under bump pattern 140. The patterning of the first insulating layer 111 may be performed using exposure and development processes. In some embodiments, each of the holes 111T will have a downward wedge or downwardly tapering shape.

Figure 6:
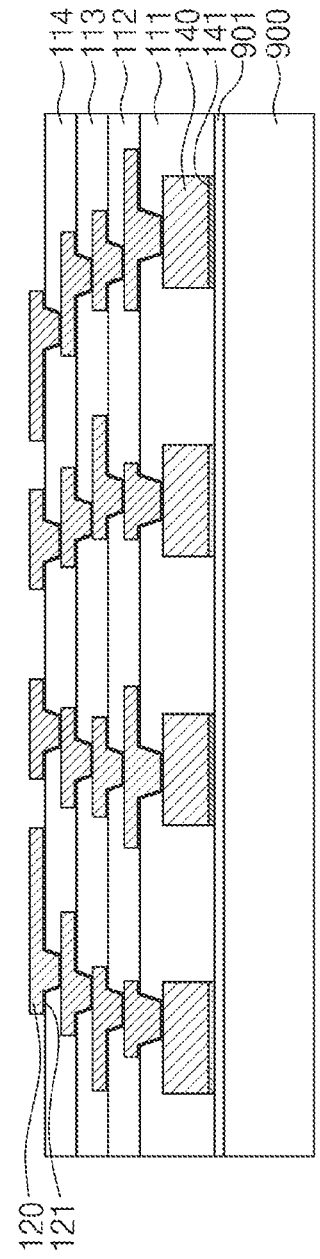

Referring to FIG. 6, redistribution seed patterns 121 may be variously formed on a top surface of the first insulating layer 111. For example, the redistribution seed pattern 121 may conformally cover a portion of the top surface of the first insulating layer 111, as well as an inner sidewall and a bottom surface of each of the holes 111T. The redistribution seed patterns 121 may be formed using deposition and etching processes.

Redistribution patterns 120 may now be respectively formed on the redistribution seed patterns 121. Each redistribution patterns 120 may fill a remaining portion of each one of the holes 111T, and may cover at least a portion of a top surface of each of the redistribution seed patterns 121. Various redistribution patterns 120 may be formed using an electroplating process that uses the redistribution seed patterns 121 as electrodes, followed by an etching process to form a first level of the redistribution pattern 120.

The second insulating layer 112 may be formed on the first insulating layer 111 to cover the first insulating layer 111 and the first level of the redistribution pattern 120. The second insulating layer 112 may be formed using a coating process, such as a spin coating process or a slit coating process. As previously described, holes may be selectively formed in the second insulating layer 112, and redistribution seed patterns 121 and redistribution patterns 120 may be sequentially formed to form a second level of the redistribution pattern 120. And this approach may be repeatedly used to form a third level and a fourth level of the redistribution pattern 120 in relation to the third insulating layer 113 and the fourth insulating layer 114.

Figure 7:
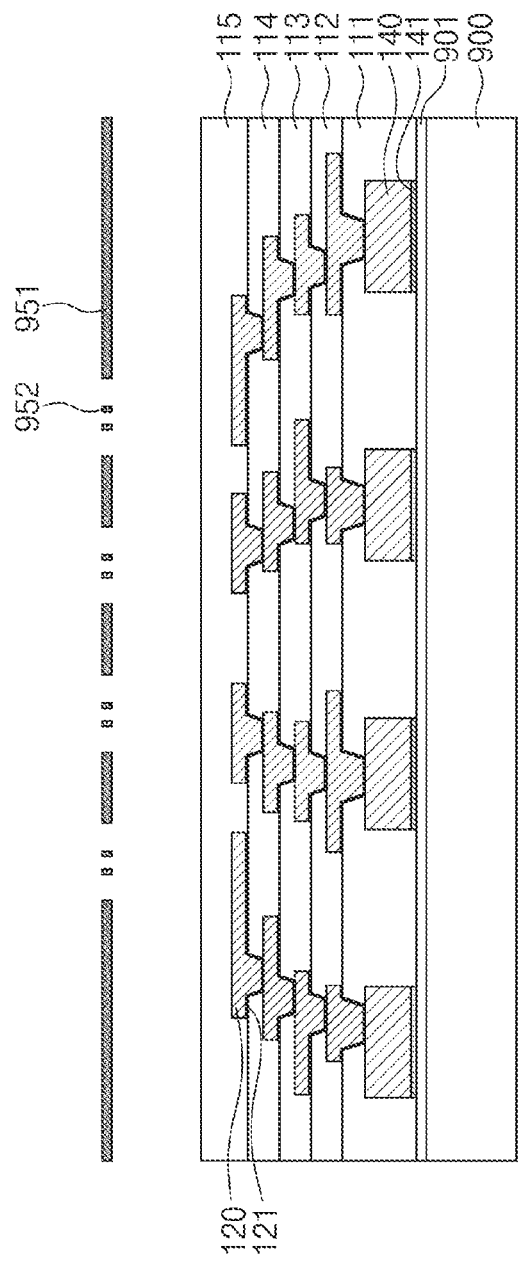

Referring to FIG. 7, the fifth insulating layer 115 may be formed on the fourth insulating layer 114 to cover the fourth insulating layer 114 and the fourth level of the redistribution pattern 120. A first mask 951 and a second mask 952 may be provided over the fifth insulating layer 115, wherein the first mask 951 and the second mask 952 include materials having different light transmittance properties. For example, a light transmittance of the second mask 952 may be greater than a light transmittance of the first mask 951.

In some embodiments, the first mask 951 and the second mask 952 may include one or more conductive materials, such as metal. For example, the first mask 951 may include chromium (Cr) and the second mask 952 may include molybdenum (Mo). Light may be irradiated onto the first mask 951 and the second mask 952 to perform selective exposure processing followed by one or more development process(es).

Figure 8:
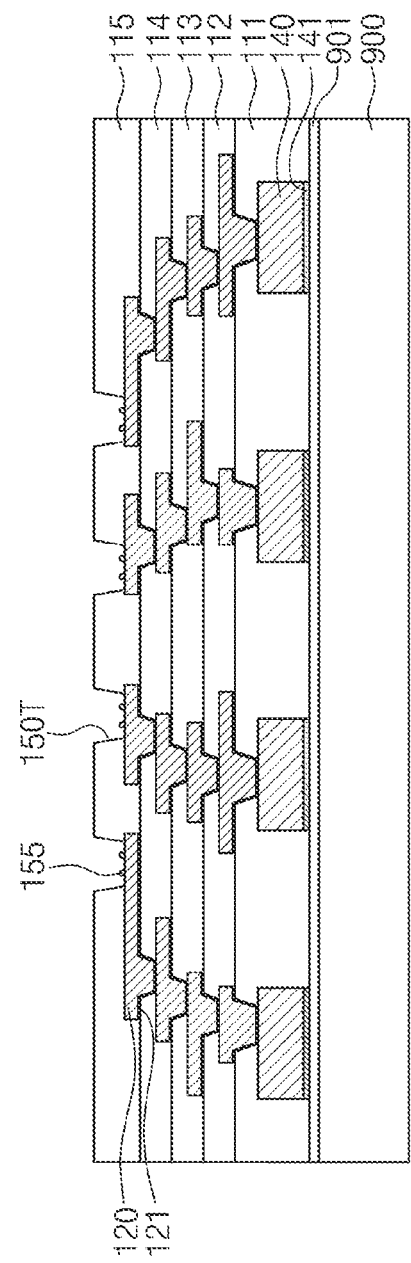

Referring to FIG. 8, the fifth insulating layer 115 may, accordingly, be patterned by the exposure/development processes to selectively form recess regions 150T in the fifth insulating layer 115. Each of the recess regions 150T may expose a portion of a top surface of an uppermost one of the redistribution patterns 120 e.g., the fourth level of the redistribution patterns 120 in the illustrated example). Each of the recess regions 150T may have a tapered shape.

However, the patterning of the fifth insulating layer 115 may include a selective patterning to form the shaped insulating pattern 155 on bottom surfaces of each of the recess regions 150T. Here, an area in which the shaped insulating pattern 155 is formed may correspond to an area defined by the second mask 952. Hence, a selectively shaped portion of the fifth insulating layer 115 may remain (i.e., not be removed) due to the difference in light transmittance properties between the first mask 951 and the second mask 952, as the shaped insulating pattern 155. Using this approach, the shaped insulating pattern 155 having a desired (and potentially complex) shape may be achieved. As a result, the shaped insulating pattern 155 may be formed simultaneously with the formation of the recess regions 150T without a requirement of additional processing.

Figure 9:
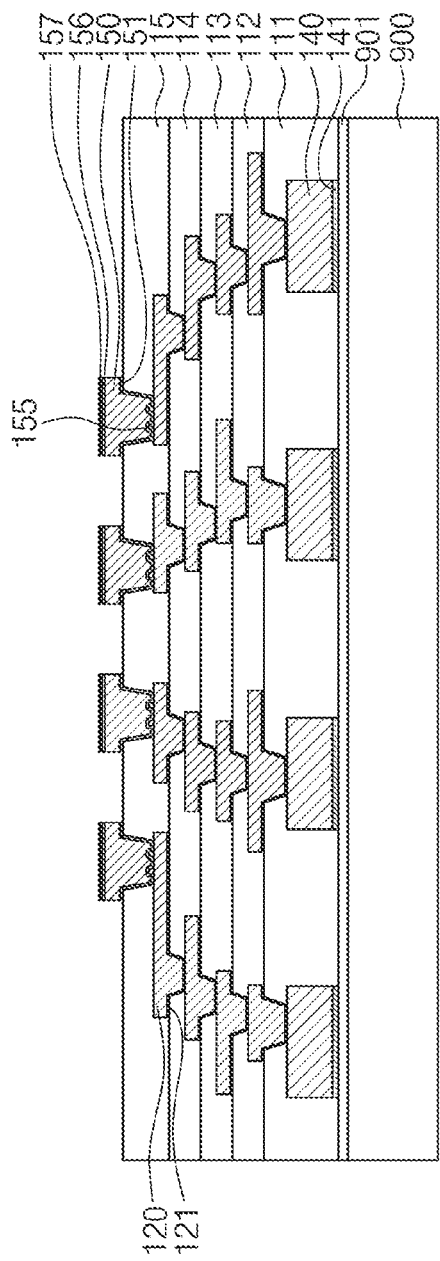

Referring to FIG. 9, respective pad seed patterns 151 may be formed in the recess regions 150T and on the shaped insulating patterns 155. Each of the pad seed patterns 151 may be conformally formed on an inner sidewall and the bottom surface of each of the recess regions 150T to cover the shaped insulating patterns 155. The pad seed patterns 151 may be formed using deposition and etching processes. Pad patterns 150 may be respectively formed on the pad seed patterns 151. Each of the pad patterns 150 may fill a remaining portion of a corresponding recess region 150T and may also cover a portion of a top surface of each of the pad seed patterns 151. The pad patterns 150 may be formed using an electroplating process that uses the pad seed patterns 151 as electrodes, followed by an etching process.

A first metal pattern 156 and a second metal pattern 157 may be sequentially formed on each of the pad patterns 150. The first metal pattern 156 may be conformally formed on the pad pattern 150 to cover a top surface of the pad pattern 150. The second metal pattern 157 may be conformally formed on the first metal pattern 156 to cover a top surface of the first metal pattern 156.

Figure 10:
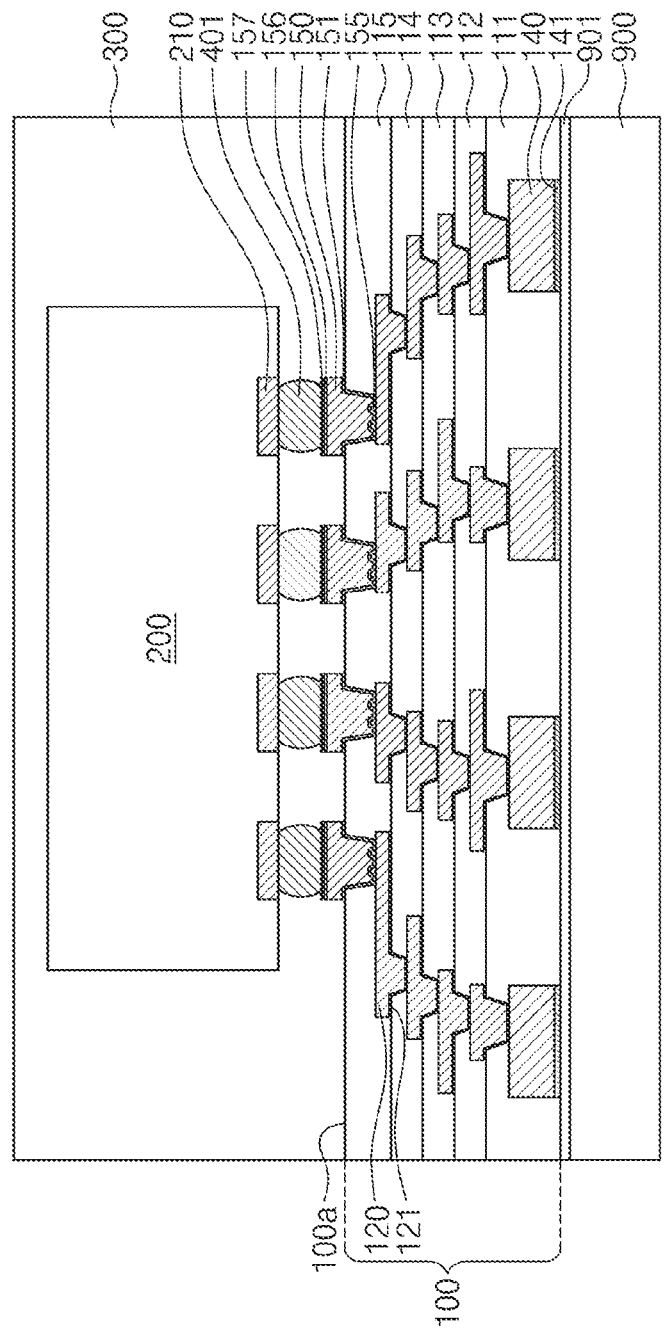

Referring to FIG. 10, a semiconductor chip 200 including chip pads 210 may be mounted on the second metal patterns 157. The semiconductor chip 200 may be disposed in such a manner that the chip pads 210 are respectively aligned with the pad patterns 150. First connection terminals 401 may be formed between the semiconductor chip 200 and the redistribution substrate 100. The first connection terminals 401 may be electrically connected to the chip pads 210 and the pad patterns 150.

A molding layer 300 may be formed on the fifth insulating layer 115 to cover a top surface of the fifth insulating layer 115. The molding layer 300 may seal (or encapsulate) the semiconductor chip 200 and the first connection terminals 401 to protect against environmental effects.

Referring to FIGS. 1 and 10, the carrier substrate 900 and the carrier adhesive layer 901 may be removed to expose a bottom surface of the first insulating layer 111 and bottom surfaces of the lower seed patterns 141. The lower seed patterns 141 may be removed to expose bottom surfaces of the under bump patterns 140. The removal of the lower seed patterns 141 may be performed by an etching process. Since the lower seed patterns 141 are removed, the bottom surfaces of the under bump patterns 140 may be disposed at a higher level than the bottom surface 100b of the insulating layer 110.

Second connection terminals 400 may be formed on the bottom surfaces of the under bump patterns 140. The formation of the second connection terminals 400 may include a process attaching a solder ball.

In the foregoing description, a single semiconductor package 10 has been was described for clarity and convenience. However, embodiments of the inventive concept are not limited to only the chip-level manufacture of the semiconductor package 10. Rather, embodiments of the inventive concept also encompass the panel-level and wafer level manufacture of multiple semiconductor packages.

Figure 11:
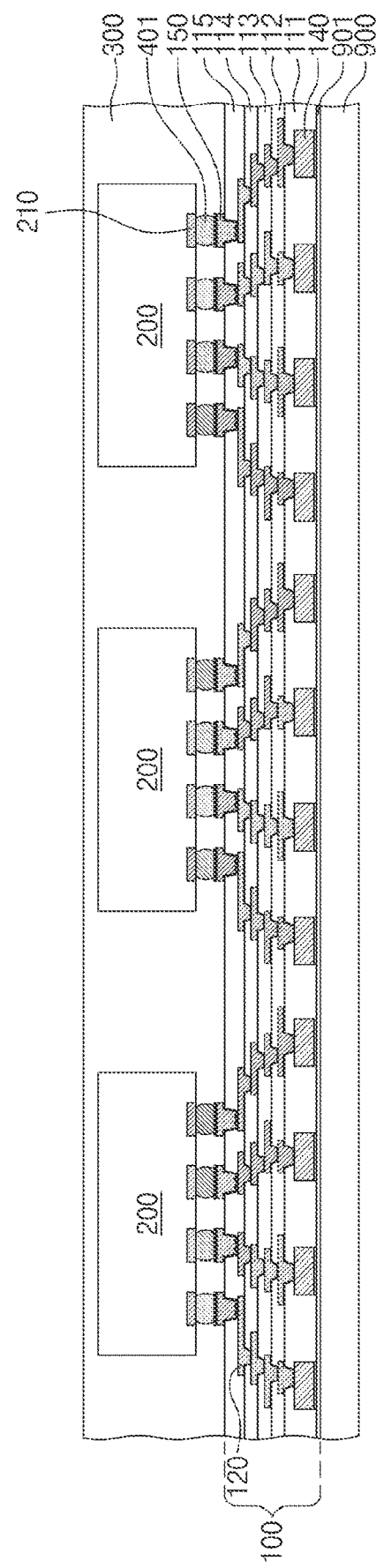
FIGS. 11 and 12 are respective cross-sectional views illustrating method(s) of manufacture for semiconductor packages according to embodiments of the inventive concept.
Figure 12:
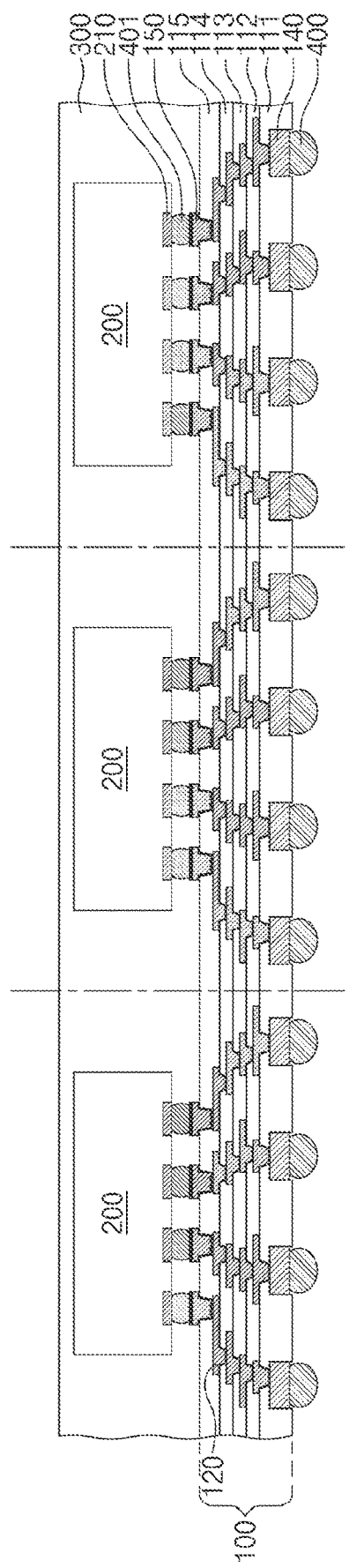

FIGS. 11 and 12 are cross-sectional views illustrating a method of manufacture for a semiconductor package according to embodiments of the inventive concept.

Referring to FIG. 11, a redistribution substrate 100 may be formed on a carrier substrate 900. The redistribution substrate 100 may include the redistribution patterns 120, the insulating layer 110 and the under bump pattern 140. The insulating layer 110 may again include sequentially stacked, first to fifth insulating layers 111, 112, 113, 114 and 115. Formation of the insulating layer 110, the under bump pattern 140, the redistribution pattern 120 and the pad patterns 150 may be substantially the same as that described in relation to FIGS. 1 and 5 to 10.

A number of semiconductor chip 200 may be respectively provided on the redistribution substrate 100 in such a way that chip pads 210 of the respective semiconductor chips 200 face the redistribution substrate 100. First connection terminals 401 may be formed between the pad patterns 150 and the chip pads 210. The formation of the first connection terminals 401 and the molding layer 300 may be substantially the same that described in relation to FIGS. 1 and 5 to 10.

Referring to FIG. 12, the carrier substrate 900 and the carrier adhesive layer 901 may be removed to expose a bottom surface of the first insulating layer 111 and bottom surfaces of the lower seed patterns 141. The lower seed patterns 141 may be removed to expose bottom surfaces of the under bump pattern 140. Second connection terminals 400 may then be formed on the bottom surfaces of the under bump pattern 140. The formation of the second connection terminals 400 may be substantially the same as that described in relation to FIGS. 1 and 5 to 10.

The molding layer 300 and the redistribution substrate 100 may be separated (e.g., sawed) along one-dot chain lines to singulate the semiconductor packages 10.

Figure 13:
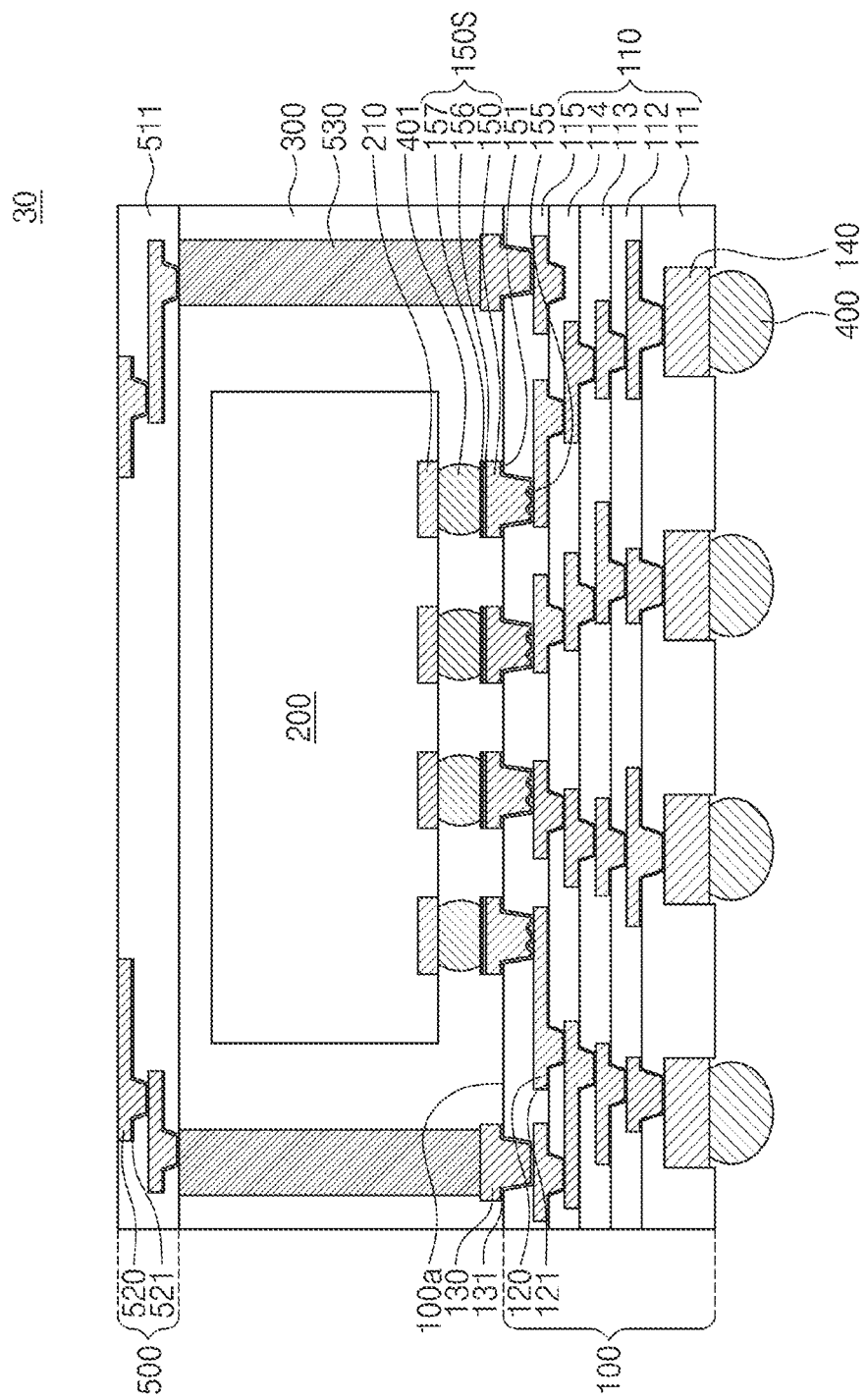
FIGS. 13, 14 and 15 are respective cross-sectional views variously illustrating semiconductor packages according to embodiments of the inventive concept.

FIG. 13 is a cross-sectional view illustrating a semiconductor package 30 according to embodiments of the inventive concept.

Referring to FIG. 13, the semiconductor package 30 may have substantially the same configuration of components as previously described in relation to FIGS. 1, 2A and 3A, and make be manufactured using substantially the same method as described in relation to FIGS. 1 and 5 to 10.

However, a conductive seed pattern 131 (like the conductive seed pattern 151) may be conformally formed on an inner surface of a recess region in the fifth insulating layer 115. Then, a conductive pattern 130 (like conductive pad 150) may be formed on the conductive seed pattern 131 and may fill a remaining portion of the recess region in the fifth insulating layer 115.

A vertically-extending conductive structure 530 (e.g., a metal pillar) may be provided on the conductive pattern 130. The conductive structure 530 may be laterally spaced apart to one side of the semiconductor chip 200. The conductive structure 530 may be electrically connected to the redistribution patterns 120. The molding layer 300 may be formed on the redistribution substrate 100 to cover the top surface of the insulating layer 110, sidewall surfaces of the conductive structure 530, and the semiconductor chip 200.

An upper redistribution layer 500 may be provided on a top surface of the conductive structure 530 and the molding layer 300. The upper redistribution layer 500 may include an upper insulating layer 511, upper redistribution patterns 520, and upper seed layers 521. The upper insulating layer 511 may be formed using substantially the same method as that used to form the insulating layer 110. The upper redistribution patterns 520 may be formed using substantially the same method as that used to form the redistribution patterns 120, and the upper seed layer 521 may be formed using substantially the same method as that used to form the redistribution seed pattern 121.

Except for the conductive structure 530, the conductive pattern 130, the conductive seed pattern 131 and the upper redistribution layer 500, other components and/or features of the semiconductor package 30 may be substantially the same as those described in relation to FIGS. 1, 2A and 3A.

Figure 14:
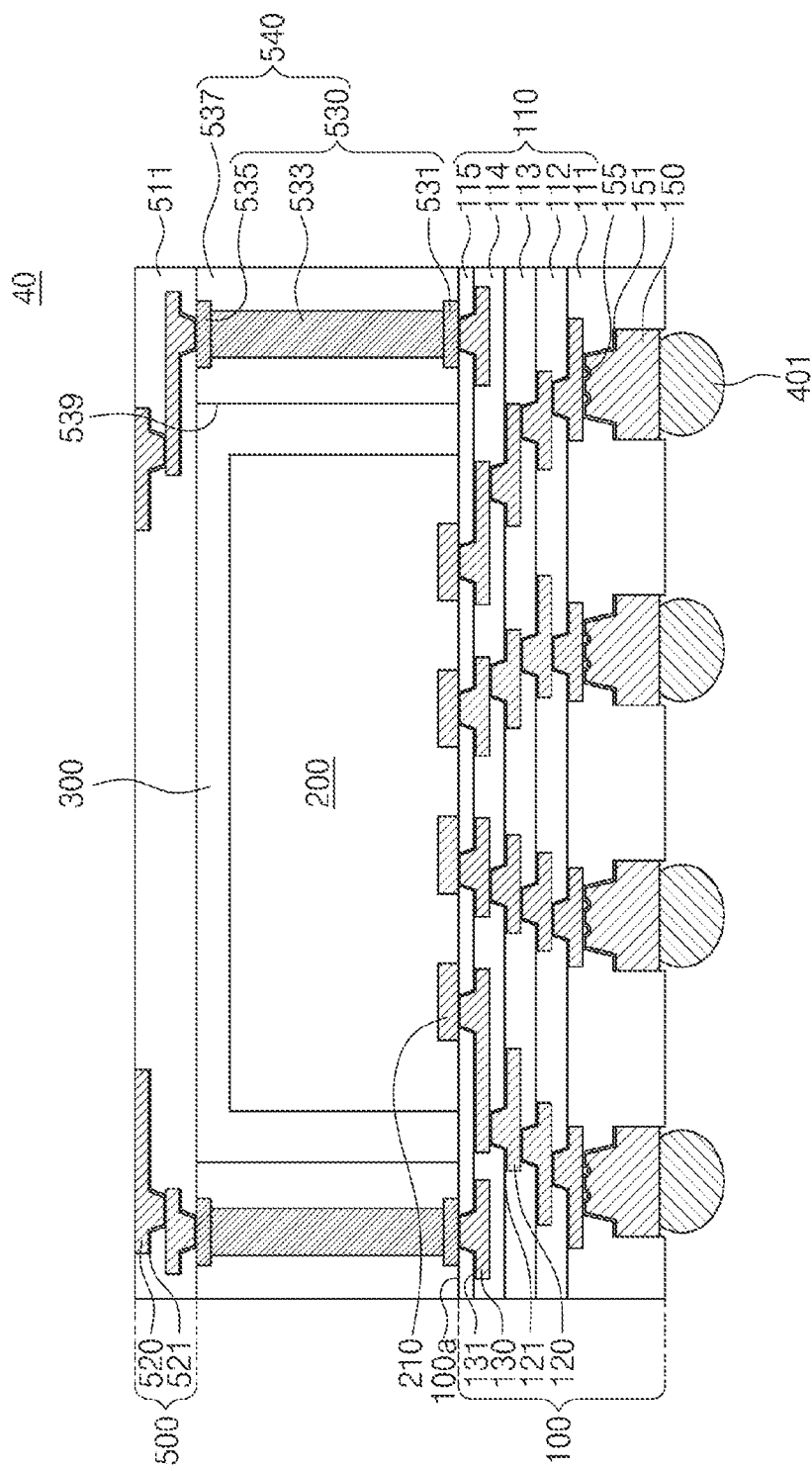

FIG. 14 is a cross-sectional view illustrating a semiconductor package 40 according to embodiments of the inventive concept.

Referring to FIG. 14, the semiconductor package 40 may include the redistribution substrate 100, the pad pattern 150, the conductive pattern 130, the conductive seed pattern 131, the semiconductor chip 200, the molding layer 300, the upper redistribution layer 500, the conductive structure 530, as well as a connection substrate 540. Here, the redistribution substrate 100, the pad pattern 150 and the semiconductor chip 200 may be substantially the same as described above.

The conductive pattern 130 and the conductive seed pattern 131 may be sequentially formed on the insulating layer 110. The conductive pattern 130 may have substantially the same features as the redistribution patterns 120 described above. The conductive seed pattern 131 may have substantially the same features as the redistribution seed pattern 121 described above.

The connection substrate 540 may be disposed on the redistribution substrate 100. The connection substrate 540 may have a connection hole 539 penetrating the connection substrate 540. For example, the connection hole 539 may be formed in a printed circuit board (PCB) to manufacture the connection substrate 540. The connection hole 539 may be formed in a central region of the connection substrate 540 when viewed in a plan view. The connection substrate 540 may include the conductive structure 530 and a base layer 537. The base layer 537 may include a single layer or a plurality of stacked layers. The base layer 537 may include an insulating material. For example, the base layer 537 may include at least one of; a carbon-based material (e.g., graphite or graphene), a ceramic, a polymer (e.g., nylon, polycarbonate, or polyethylene), etc. The connection hole 539 may penetrate the base layer 537.

The conductive structure 530 may be provided on the conductive pattern 130 and may be provided in the base layer 537. As before, the conductive structure 530 may be spaced apart from the semiconductor chip 200. The conductive structure 530 may be electrically connected to the redistribution patterns 120. The conductive structure 530 may include a first pad 531, a conductive via 533, and a second pad 535. The first pad 531 may be exposed at a bottom surface of the connection substrate 540, and the second pad 535 may be exposed at a top surface of the connection substrate 540. The conductive via 533 may be provided between the first pad 531 and the second pad 535. The conductive via 533 may penetrate the base layer 537 and may be electrically connected to the first pad 531 and the second pad 535. The conductive structure 530 may be electrically connected to the first connection terminals 401 or the semiconductor chip 200 through the redistribution patterns 120. The conductive structure 530 may include one or more conductive material(s) such as copper (Cu), aluminum (Al), gold (Au), lead (Pb), stainless steel (SUS), silver (Ag), iron (Fe), and/or any alloy thereof.

The semiconductor chip 200 may be provided in the connection hole 539 of the connection substrate 540. The semiconductor chip 200 may be provided before or after disposing the connection substrate 540.

The molding layer 300 may be formed on the redistribution substrate 100 to fill the connection hole 539. The molding layer 300 may fill a gap between the semiconductor chip 200 and the connection substrate 540 and may cover the semiconductor chip 200. In this case, the semiconductor chip 200 may be fixed to the connection substrate 540 by the molding layer 300. The molding layer 300 may include an insulating polymer such as an epoxy-based polymer. For example, the molding layer 300 may include an adhesive insulating film such as an Ajinomoto build-up film (ABF). The upper redistribution layer 500 may be provided on a top surface of the connection substrate 540 and the molding layer 300. The upper redistribution layer 500 may be substantially the same as described above with reference to FIG. 13.

Figure 15:
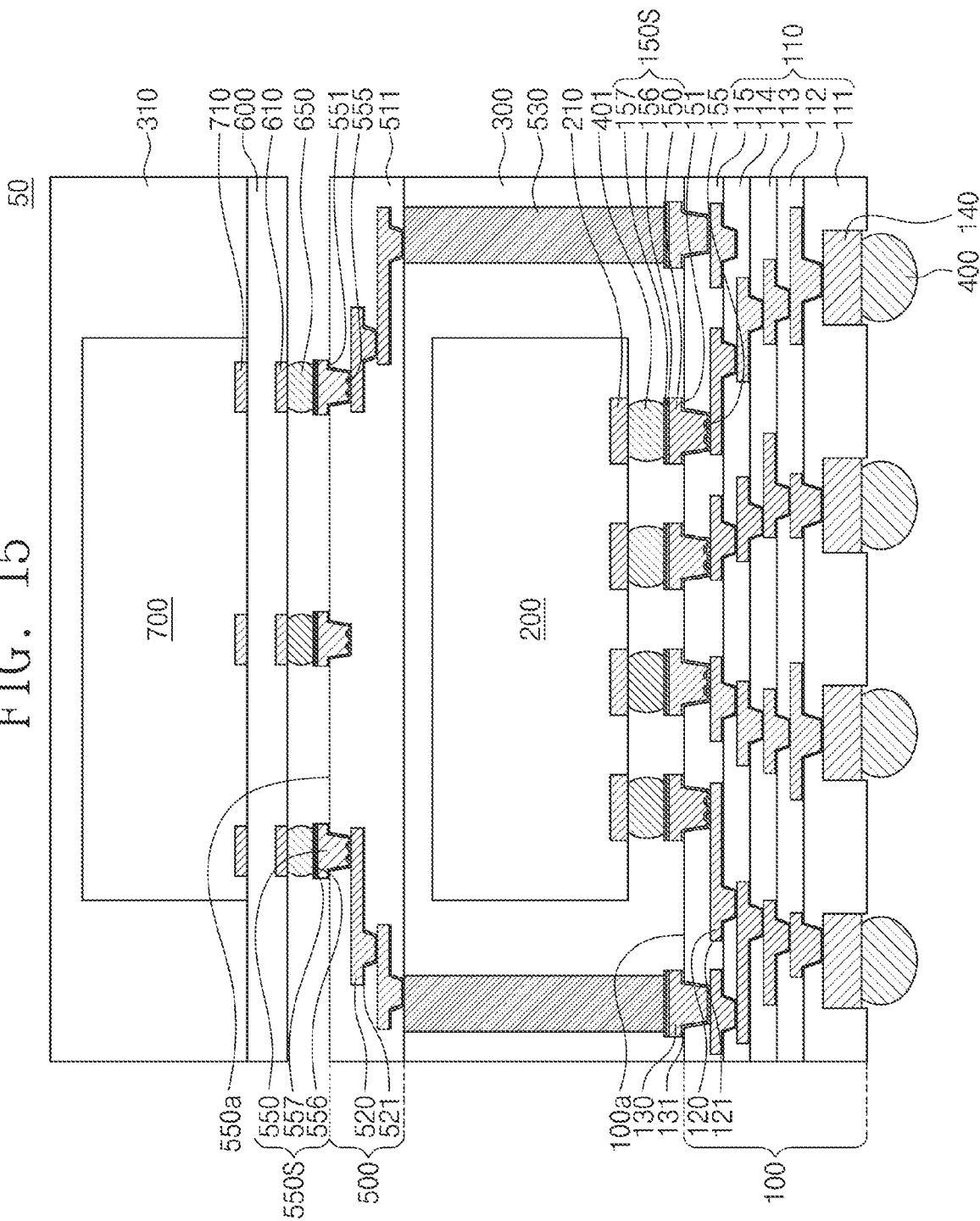

FIG. 15 is a cross-sectional view illustrating a semiconductor package 50 according to embodiments of the inventive concept.

Referring to FIG. 15, the semiconductor package 50 may include the redistribution substrate 100, the pad structure 150S, the semiconductor chip 200, the molding layer 300, the upper redistribution layer 500, the conductive structure 530, the conductive pattern 130 and the conductive seed pattern 131, and may further include an upper substrate 600, an upper pad structure 550S, an upper semiconductor chip 700, third connection terminals 650 and an upper molding layer 310. The redistribution substrate 100, the pad structure 150S, the semiconductor chip 200, the molding layer 300, the upper redistribution layer 500, the conductive structure 530, the conductive pattern 130 and the conductive seed pattern 131 may be substantially the same as described above.

Another shaped insulating pattern 555 may be formed on a bottom surface of a recess region in the upper redistribution layer 500. Here again, portion(s) of the another shaped insulating pattern 555 may have a hemispherical, upwardly-convex, a quadrilateral or a polygonal shape, and be arranged (when multiple portions are provided) in a circular, a quadrilateral or a polygonal arrangement, as viewed in plan. The another shaped insulating pattern 555 may include the same material(s) as the insulating layer 110. The another shaped insulating pattern 555 may include an organic material such as a photosensitive polymer. For example, the photosensitive polymer may include at least one of photosensitive polyimide, polybenzoxazole, a phenol-based polymer, or a benzocyclobutene-based polymer. In some embodiments, the upper insulating pattern 555 may include, but not limited to, a photo imageable dielectric (PID).

An upper seed pattern 551 may be conformally formed on an inner sidewall and the bottom surface of the recess region in the upper redistribution layer 500 and may cover a portion of a top surface of the another shaped insulating pattern 555. The upper pad structure 550S may be provided on the upper seed pattern 551. The upper pad structure 550S may be connected to an uppermost one of the upper redistribution patterns 520. The upper pad structure 550S may include an upper pad pattern 550, a first upper metal pattern 556 on the upper pad pattern 550, and a second upper metal pattern 557 on the first upper metal pattern 556. The upper pad pattern 550 may fill a remaining portion of the recess region in the upper redistribution layer 500. The upper pad pattern 550 may include one or more conductive material(s) such as copper (Cu). The upper pad pattern 550 may include an upper pad via which has a shape protruding toward the bottom surface of the redistribution substrate 100, and an upper pad interconnection which is provided on the upper pad via and has a long axis extending in the direction parallel to the top surface 100a of the redistribution substrate 100. The upper seed pattern 551 may include one or more conductive material(s) such as copper (Cu), titanium (Ti) and/or any alloy thereof. The first upper metal pattern 556 and the second upper metal pattern 557 may be conformally formed on the upper pad pattern 550. The first upper metal pattern 556 and the second upper metal pattern 557 may include different materials from each other. The first upper metal pattern 556 may include one or more conductive material(s) such as nickel (Ni). The second upper metal pattern 557 may include one or more conductive material(s) such as gold (Au). A top surface of the upper pad structure 550S may be exposed through the upper insulating layer 511. That is, the top surface of the upper pad structure 550S may be disposed at a higher level than a top surface 550a of the upper redistribution layer 500.

In the semiconductor package 50, the upper insulating pattern 555 may be disposed between the uppermost upper redistribution pattern 520 and the upper pad pattern 550, thereby preventing formation of a dimpled structure in which a top surface of the upper pad pattern 550 is concave. In other words, the top surface of the upper pad pattern 550 may be substantially parallel to the top surface 100a of the redistribution substrate 100. In addition, since formation of the dimpled structure is prevented, a degree of freedom in designing a size of the upper pad pattern 550 may be increased to improve electrical characteristics of the semiconductor package. Furthermore, a contact area between the upper pad pattern 550 and the upper seed pattern 551 may be increased due to the formation of the upper insulating pattern 555, and thus mechanical characteristics of the semiconductor package may be improved.

The upper substrate 600 may be provided on the upper redistribution layer 500. The upper substrate 600 may be a printed circuit board or a redistribution substrate. A substrate pad 610 may be disposed on a bottom surface of the upper substrate 600. The upper semiconductor chip 700 may be mounted on the upper substrate 600. For example, the upper semiconductor chip 700 may be a memory chip, a logic chip, or a sensing chip. However, embodiments of the inventive concept are not limited thereto. The upper semiconductor chip 700 may include upper chip pads 710 in its lower portion.

The third connection terminal 650 may be provided on the upper pad structure 550S. The third connection terminal 650 may be in contact with a top surface of the second upper metal pattern 557. The third connection terminal 650 may be provided in plurality. The third connection terminals 650 may be provided between the upper semiconductor chip 700 and the upper substrate 600. Each of the third connection terminals 650 may be provided between the upper pad structure 550S and the substrate pad 610 and may be electrically connected to the upper pad structure 550S and the substrate pad 610. In other words, the second connection terminal 400 may be electrically connected to the upper semiconductor chip 700 through the third connection terminals 650. The third connection terminal 650 may include at least one of a solder, a pillar, or a bump. The third connection terminal 650 may include one or more conductive material(s) such as tin (Sn), lead (Pb), nickel (Ni), gold (Au), silver (Ag), copper (Cu), aluminum (Al), bismuth (Bi), etc.

The upper molding layer 310 may be provided on the upper substrate 600 to cover the upper semiconductor chip 700. The upper molding layer 310 may include an insulating polymer such as an epoxy molding compound (EMC).

Except for the upper substrate 600, the upper pad structure 550S, the upper semiconductor chip 700, the third connection terminals 650 and the upper molding layer 310, other components of the semiconductor package 50 may be substantially the same as described above.

In the semiconductor package according to the embodiments of the inventive concept, the shaped insulating pattern may be formed on the bottom surface of the pad pattern without an additional process, thereby preventing formation of a dimpled structure in which the top surface of the pad pattern is concaved. As a result, a high degree of design freedom may be realized for the pad pattern, thereby improving electrical performance of the semiconductor package. In addition, a contact area between the pad pattern and the pad seed pattern may be increased by the formation of the shaped insulating pattern, thereby improving the mechanical performance of the semiconductor package.

While the inventive concept have been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scope of the inventive concept are to be determined by the broadest permissible interpretation of the following claims and their equivalents, and shall not be restricted or limited by the foregoing description.

What is claimed is:

1. A semiconductor package comprising:
   a redistribution substrate including a redistribution pattern;
   a semiconductor chip mounted on a top surface of the redistribution substrate; and
   a connection terminal between the semiconductor chip and the redistribution substrate,
   wherein the redistribution substrate further comprises
   a pad structure including a pad interconnection and a pad via, disposed between the redistribution pattern and the connection terminal, wherein the pad structure is electrically connected to the redistribution pattern and a top surface of the pad structure contacts the connection terminal,
   a shaped insulating pattern disposed on a top surface of the redistribution pattern between the pad via and the redistribution pattern, and
   a pad seed pattern disposed on the redistribution pattern and covering the shaped insulating pattern.

2. The semiconductor package of claim 1, wherein the pad structure comprises:
   a first metal pattern and a second metal pattern sequentially stacked on the pad interconnection, wherein the connection terminal contacts a top surface of the second metal pattern.

3. The semiconductor package of claim 1, wherein the redistribution substrate further includes an insulating layer, the insulating layer covers the redistribution pattern and the pad via, and the shaped insulating pattern includes a same material as the insulating layer.

4. The semiconductor package of claim 1, wherein the shaped insulating pattern includes a photosensitive polymer.

5. The semiconductor package of claim 1, wherein the shaped insulating pattern includes multiple portions arranged in one of a circular arrangement, a quadrilateral arrangement and a polygonal arrangement, as viewed in plan.

6. The semiconductor package of claim 1, wherein the shaped insulating pattern includes at least one portion, and a maximum width of the at least one portion of the shaped insulating pattern is less than a minimum width of the pad via.

7. The semiconductor package of claim 6, wherein the maximum width of the at least one portion of the shaped insulating pattern ranges from between about 1 μm to about 15 μm.

8. The semiconductor package of claim 1, wherein the shaped insulating pattern includes at least one portion, and a maximum thickness of the at least one portion of the shaped insulating pattern is less than a thickness of the pad via.

9. The semiconductor package of claim 8, wherein the maximum thickness of the at least one portion of the shaped insulating pattern ranges from between about 1 μm to about 2 μm.

10. A semiconductor package comprising:
a redistribution substrate including a redistribution pattern and an insulating layer;
a semiconductor chip mounted on a top surface of the redistribution substrate;
a first connection terminal between the semiconductor chip and the redistribution substrate; and
a molding layer provided on the redistribution substrate and covering the semiconductor chip,
wherein the redistribution substrate further includes comprises
a pad structure including a pad via and a pad interconnection, disposed in contact with a bottom surface of the first connection terminal, wherein a top surface of the pad structure is disposed at a higher level than the top surface of the redistribution substrate,
a pad seed pattern disposed between the redistribution pattern and the pad structure, and
a shaped insulating pattern including at least one portion disposed between a top surface of the redistribution pattern and the pad seed pattern, wherein the at least one portion of the shaped insulating pattern having a maximum width less than a minimum width of the pad via.

11. The semiconductor package of claim 10, further comprising:
a second connection terminal on a bottom surface of the redistribution substrate; and
an under bump pattern in contact with a top surface of the second connection terminal and electrically connected to the redistribution pattern.

12. The semiconductor package of claim 10, wherein the molding layer covers the pad interconnection, and the insulating layer covers the pad via.

13. The semiconductor package of claim 10, further comprising:
an upper redistribution layer on the molding layer and including an upper redistribution pattern; and
a conductive structure extending between the redistribution substrate and the upper redistribution layer,
wherein the redistribution substrate and the upper redistribution layer are electrically connected through the conductive structure.

14. The semiconductor package of claim 13, further comprising:
an upper substrate disposed on a top surface of the upper redistribution layer;
an upper semiconductor chip mounted on a top surface of the upper substrate; and
an upper molding layer covering the top surface of the upper substrate and the upper semiconductor chip.

15. The semiconductor package of claim 14, further comprising:
a third connection terminal between the upper redistribution layer and the upper substrate;
an upper pad structure between the upper redistribution pattern and the third connection terminal;
another shaped insulating pattern disposed on a top surface of the upper redistribution pattern; and
an upper seed pattern disposed on the upper redistribution pattern and covering the another shaped insulating pattern,
wherein the upper pad structure is electrically connected to the upper redistribution pattern.

16. The semiconductor package of claim 15, wherein the upper pad structure includes an upper pad via and an upper pad interconnection,
a top surface of the upper pad structure contacts a bottom surface of the third connection terminal, and
the top surface of the upper pad structure is disposed at a higher level than the top surface of the upper redistribution layer.

17. The semiconductor package of claim 16, wherein the upper pad structure further comprises a first upper metal pattern and a second upper metal pattern sequentially stacked on the upper pad interconnection, and
the third connection terminal contacts a top surface of the second upper metal pattern.

18. A semiconductor package comprising:
a redistribution substrate including a redistribution pattern covered by an insulating layer;
a pad structure disposed on a surface of the redistribution substrate;
a connection terminal on the pad structure;
the redistribution substrate further comprising
a pad via extending through the insulating layer and in electrical contact with the redistribution pattern, and
a pad interconnection on the insulating layer and the pad via, and in electrical contact with the connection terminal; and
a shaped insulating pattern disposed on the surface of the redistribution pattern between the pad via and the redistribution pattern.

19. The semiconductor package of claim 18, further comprising a pad seed pattern disposed on the surface of the redistribution pattern and covering the shaped insulating pattern.

20. The semiconductor package of claim 18, wherein the shaped insulating pattern comprises multiple portions laterally spaced from each other.

* * * * *